US012690219B2

(12) United States Patent
Kajiwara et al.

(10) Patent No.: US 12,690,219 B2
(45) Date of Patent: Jul. 21, 2026

(54) SEMICONDUCTOR DEVICE AND METHOD FOR MANUFACTURING THE SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yosuke Kajiwara, Yokohama (JP); Miyoko Shimada, Yokohama (JP); Kento Minamikawa, Yokohama (JP); Hiroshi Ono, Tokyo (JP); Daimotsu Kato, Kawasaki (JP); Masahiko Kuraguchi, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 321 days.

(21) Appl. No.: 18/451,218

(22) Filed: Aug. 17, 2023

(65) Prior Publication Data

US 2024/0274703 A1      Aug. 15, 2024

(30) Foreign Application Priority Data

Feb. 14, 2023     (JP) ................................. 2023-020566

(51) Int. Cl.
*H10D 30/47*          (2025.01)
*H10D 30/01*          (2025.01)
(Continued)

(52) U.S. Cl.
CPC ......... *H10D 30/475* (2025.01); *H10D 30/015* (2025.01); *H10D 30/47* (2025.01);
(Continued)

(58) Field of Classification Search
CPC ............... H10D 30/475; H10D 30/015; H10D 62/8503; H10D 30/478; H10D 62/117;
(Continued)

(56) References Cited

U.S. PATENT DOCUMENTS 10,522,646 B2 * 12/2019 Lucolano ............. H10D 30/015
2016/0020313 A1 * 1/2016 Wu ...................... H10D 62/824
                                                                  257/194

(Continued)

FOREIGN PATENT DOCUMENTS

JP          2008210836 A      9/2008
JP          2017059599 A      3/2017
(Continued)

OTHER PUBLICATIONS

Office Action issued on Apr. 17, 2026, in corresponding Japanese Application No. 2023-020566, 21 pages.

*Primary Examiner* — David Vu
*Assistant Examiner* — Brandon C Fox
(74) *Attorney, Agent, or Firm* — Maier & Maier, PLLC

(57) ABSTRACT

According to one embodiment, a semiconductor device includes a first electrode, a second electrode, a third electrode, a first semiconductor region, a second semiconductor region, a first nitride region, and a first insulating member. The first semiconductor region includes $Al_{x1}Ga_{1-x1}N$ ($0 \leq x1 < 1$). The second semiconductor region includes $Al_{x2}Ga_{1-x2}N$ ($0 < x2 < 1$, $x1 < x2$). A first nitride portion thickness along a second direction of the first nitride portion is thicker than a second nitride portion thickness along the first direction of the part of the second nitride portion. A first semiconductor portion thickness along the second direction of the first semiconductor portion is thicker than the first nitride portion thickness.

17 Claims, 8 Drawing Sheets

(51) Int. Cl.

| | | |
|---|---|---|
| *H10D 62/10* | (2025.01) | |
| *H10D 62/85* | (2025.01) | |
| *H10D 64/27* | (2025.01) | |

(52) U.S. Cl.
CPC ......... *H10D 30/478* (2025.01); *H10D 62/105* (2025.01); *H10D 62/117* (2025.01); *H10D 62/124* (2025.01); *H10D 62/8503* (2025.01); *H10D 64/512* (2025.01); *H10D 64/513* (2025.01)

(58) Field of Classification Search
CPC .. H10D 64/512; H10D 64/513; H10D 62/105; H10D 30/47; H10D 62/124
See application file for complete search history.

(56) References Cited

U.S. PATENT DOCUMENTS

| | | |
|---|---|---|
| 2017/0077277 A1 | 3/2017 | Saito et al. |
| 2019/0088770 A1 | 3/2019 | Tajima et al. |
| 2020/0027977 A1 | 1/2020 | Tajima et al. |
| 2020/0295169 A1* | 9/2020 | Kato ..................... H10D 64/513 |
| 2021/0118984 A1 | 4/2021 | Shimizu |
| 2022/0045202 A1 | 2/2022 | Kajiwara et al. |
| 2022/0130986 A1* | 4/2022 | Kato ................... H01L 23/3171 |
| 2022/0384422 A1 | 12/2022 | Mukai |
| 2022/0384629 A1* | 12/2022 | Mukai ................. H10D 30/477 |
| 2023/0025093 A1* | 1/2023 | Kajiwara ........... H10D 62/8503 |
| 2023/0411506 A1* | 12/2023 | Okita ................... H10D 30/475 |

FOREIGN PATENT DOCUMENTS

| | | |
|---|---|---|
| JP | 2020017579 A | 1/2020 |
| JP | 2020150141 A | 9/2020 |
| JP | 2020174202 A | 10/2020 |
| JP | 2021068722 A | 4/2021 |
| JP | 2022184315 A | 12/2022 |
| JP | 2023017194 A | 2/2023 |
| KR | 1020140014778 A | 2/2014 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2023-020566, filed on Feb. 14, 2023; the entire contents of which are incorporated herein by reference.

FIELD

Embodiments of the invention generally relate to a semiconductor device and a method for manufacturing the same.

BACKGROUND

For example, semiconductor devices are desired to have improved characteristics.

DETAILED DESCRIPTION

Figure 1:
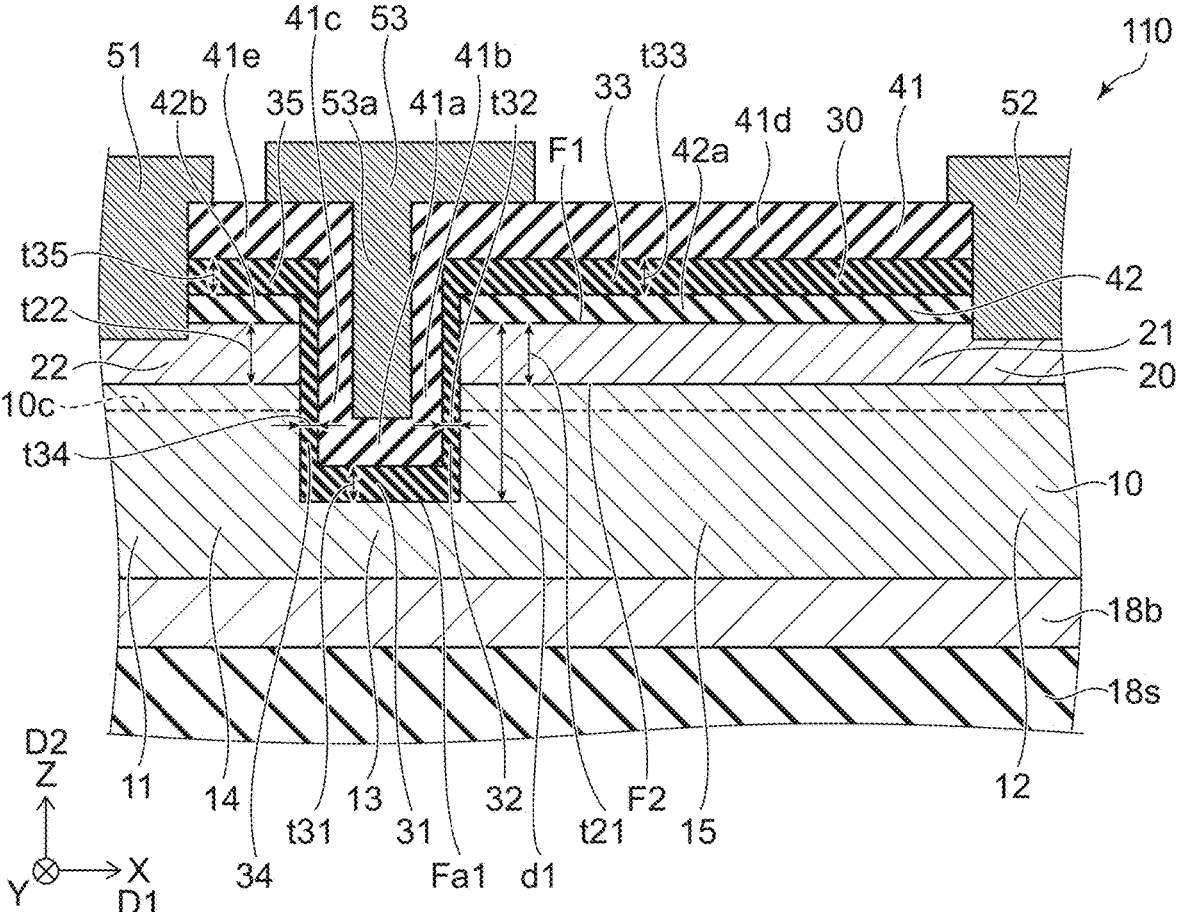
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a first nitride region, and a first insulating member. A direction from the first electrode to the second electrode is along a first direction. The third electrode includes a first electrode portion. A position of the third electrode in the first direction being between a position of the first electrode in the first direction and a position of the second electrode in the first direction. The first semiconductor region includes $Al_{x1}Ga_{1-x1}N$ ($0 \leq x1 < 1$). The first semiconductor region includes a first partial region, a second partial region, a third partial region, a fourth partial region, and a fifth partial region. A second direction from the first partial region to the first electrode crosses the first direction. A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 < x2 < 1$, $x1 < x2$). The second semiconductor region includes a first semiconductor portion. A direction from the fifth partial region to the first semiconductor portion is along the second direction. The first nitride region includes Al and N. The first nitride region includes a first nitride portion and a second nitride portion. The first nitride portion is located between the third partial region and the first electrode portion in the second direction. The first insulating member includes a first insulating portion and a second insulating portion. The first insulating portion is located between the first nitride portion and the first electrode portion. A part of the second nitride portion is located between the first insulating portion and the fifth partial region in the first direction. Another part of the second nitride portion is located between the second insulating portion and the first semiconductor portion. A first nitride portion thickness along the second direction of the first nitride portion is thicker than a second nitride portion thickness along the first direction of the part of the second nitride portion. A first semiconductor portion thickness along the second direction of the first semiconductor portion is thicker than the first nitride portion thickness.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first semiconductor region 10, a second semiconductor region 20, a first nitride region 30, and a first insulating member 41.

A direction from the first electrode 51 to the second electrode 52 is along a first direction D1. The first direction D1 is defined as an X-axis direction. One direction perpendicular to the X-axis direction is defined as a Z-axis direction. A direction perpendicular to the X-axis direction and the Z-axis direction is defined as a Y-axis direction.

The third electrode 53 includes a first electrode portion 53a. A position of the third electrode 53 in the first direction D1 is between a position of the first electrode 51 in the first direction D1 and a position of the second electrode 52 in the first direction D1.

The first semiconductor region 10 includes $Al_{x1}Ga_{1-x1}N$ ($0 \leq x1 < 1$). The composition ratio x1 may be, for example, not less than 0 and not more than 0.1. The first semiconductor region 10 is, for example, a GaN layer.

The first semiconductor region 10 includes a first partial region 11, a second partial region 12, a third partial region 13, a fourth partial region 14 and a fifth partial region 15. A second direction D2 from the first partial region 11 to the first electrode 51 crosses the first direction D1. The second direction D2 is, for example, the Z-axis direction.

A direction from the second partial region 12 to the second electrode 52 is along the second direction D2. A direction from the third partial region 13 to the first electrode portion 53a is along the second direction D2. A position of the fourth partial region 14 in the first direction D1 is between a position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1.

The second semiconductor region 20 includes $Al_{x2}Ga_{1-x2}N$ ($0<x2<1$, $x1<x2$). The composition ratio x2 is, for example, more than 0.1 and not more than 0.35. The second semiconductor region 20 is, for example, an AlGaN layer. The second semiconductor region 20 includes a first semiconductor portion 21. A direction from the fifth partial region 15 to the first semiconductor portion 21 is along the second direction D2.

The first nitride region 30 includes Al and N. The first nitride region 30 may be AlN, for example. The first nitride region 30 includes a first nitride portion 31 and a second nitride portion 32. The first nitride portion 31 is located between the third partial region 13 and the first electrode portion 53a in the second direction D2. A direction from a part of the second nitride portion 32 to the fifth partial region 15 is along the first direction D1. A direction from another part of the second nitride portion 32 to the first semiconductor portion 21 is along the first direction D1.

A first nitride portion thickness t31 of the first nitride portion 31 along the second direction D2 is thicker than a second nitride portion thickness t32 of the second nitride portion 32 along the first direction D1. A first semiconductor portion thickness t21 along the second direction D2 of the first semiconductor portion 21 is thicker than the first nitride portion thickness t31.

The first insulating member 41 includes a first insulating portion 41a and a second insulating portion 41b. The first insulating portion 41a is located between the first nitride portion 31 and the first electrode portion 53a. The second insulating portion 41b is located between the first electrode portion 53a and the second nitride portion 32. A part of the second nitride portion 32 is located between the first insulating portion 41a and the fifth partial region 15 in the first direction D1. The other part of the second nitride portion 32 is located between the second insulating portion 41b and the first semiconductor portion 21.

In this example, the second semiconductor region 20 further includes a second semiconductor portion 22. A direction from the fourth partial region 14 to the second semiconductor portion 22 is along the second direction D2. In this example, the first electrode portion 53a is located between the first semiconductor portion 21 and the second semiconductor portion 22 in the first direction D1.

In the semiconductor device 110, a current flowing between the first electrode 51 and the second electrode 52 can be controlled by a potential of the third electrode 53. The potential of the third electrode 53 is, for example, a potential based on a potential of the first electrode 51. The first electrode 51 is, for example, a source electrode. The second electrode 52 is, for example, a drain electrode. The third electrode 53 is, for example, a gate electrode. The semiconductor device 110 is, for example, a transistor.

The first semiconductor region 10 includes a region facing the second semiconductor region 20. A carrier region 10c is formed in this region. The semiconductor device 110 is, for example, a HEMT (High Electron Mobility Transistor).

A distance between the first electrode 51 and the third electrode 53 is shorter than a distance between the second electrode 52 and the third electrode 53. It becomes easy to obtain stable operation.

As noted above, the first nitride portion thickness t31 is thicker than the second nitride portion thickness t32. By the first nitride portion thickness t31 being thick, for example, high mobility can be obtained. By the second nitride portion thickness t32 being thin, it becomes easy to obtain, for example, a high threshold voltage. According to the embodiments, it is possible to provide a semiconductor device with improved characteristics.

In the embodiment, the first nitride region 30 is provided apart from the first semiconductor portion 21 of the second semiconductor region 20. This makes it easy to obtain stable operation. For example, by providing the first nitride region 30, it is possible to suppress the intrusion of impurities from the outside into the second semiconductor region 20 during the manufacturing process.

By the first nitride portion thickness t31 being thinner than the first semiconductor portion thickness t21, for example, the Al composition ratio in the first nitride region 30 can be increased. This makes it easy to obtain a high carrier concentration. High mobility is easily obtained. For example, the time required for the manufacturing process can be shortened.

In the embodiment, at least a part of the first insulating portion 41a is located between the fourth partial region 14 and the fifth partial region 15 in the first direction D1. For example, a normally-off characteristic can be obtained.

For example, in a first configuration, the first nitride portion thickness t31 is 2 nm and the second nitride portion thickness t32 is 2 nm. In the first configuration, the channel mobility is 790 $cm^2/Vs$. The threshold voltage is 1.5V.

For example, in a second configuration, the first nitride portion thickness t31 is 2 nm and the second nitride portion thickness t32 is 1.8 nm. In the second configuration, the channel mobility is 800 $cm^2/Vs$. The threshold voltage is 2.1V.

In the embodiment, the first nitride partial thickness t31 is preferably not less than 1 nm and not more 10 nm, for example. For example, the Al composition ratio of the first nitride region 30 can be increased. High carrier mobility is easily obtained. For example, it becomes easy to obtain high crystallinity. Leak current caused by grain boundaries can be suppressed. Leak current can be reduced.

In the embodiment, the second nitride partial thickness t32 is preferably not less than 0.5 nm and not more than 5 nm, for example. For example, it becomes easy to obtain the second nitride portion 32 being stable. For example, it becomes easy to obtain a high threshold voltage. For example, it becomes easy to obtain high crystallinity. Leak current caused by grain boundaries can be suppressed. Leak current can be reduced.

In the embodiment, the first semiconductor portion thickness t21 is preferably not less than 15 nm and not more than 40 nm, for example. For example, it becomes easy to control the carrier concentration. It becomes easy to obtain stable characteristics. For example, it becomes easy to obtain high crystallinity. Leak current caused by grain boundaries can be suppressed. Leak current can be reduced.

In the embodiment, for example, the first nitride portion 31 includes $Al_{z1}Ga_{1-z1}N$ ($0<z1<1$, $x2<z1$). The second nitride portion 32 includes $Al_{z2}Ga_{1-z2}N$ ($0<z2\leq1$, $z1<z2$).

In the second semiconductor region 20, the composition ratio x2 is, for example, not less than 0.1 and not more than 0.35. In one example, the composition ratio z1 is not less than 0.6 and less than 1, for example. For example, the composition ratio z1 may be not less than 0.6 and not more than 0.98. At this time, the composition ratio z2 is more than 0.98 and not more than 1, for example.

As shown in FIG. 1, the third partial region 13 includes a first facing face Fa1. The first facing face Fa1 faces the first nitride portion 31. The first semiconductor portion 21 includes a first face F1 and a second face F2. The second face F2 faces the fifth partial region 15. The second face F2 is located between the fifth partial region 15 and the first face F1 in the second direction D2.

A distance along the second direction D2 between a position of the first facing face Fa1 in the second direction D2 and a position of the first face F1 in the second direction D2 is defined as a distance d1. In the embodiment, the distance d1 is preferably not less than 100 nm and not more than 400 nm. For example, when the distance d1 is 100 nm or more, it becomes easy to obtain an appropriately high threshold voltage. For example, when the distance d1 is 400 nm or less, it becomes easy to obtain a low on-resistance. A high threshold voltage and a low on-resistance are easily obtained.

The first insulating member 41 includes, for example, at least one selected from the group consisting of $SiO_2$, SiON, AlSiON, AlON and $Al_2O_3$.

As shown in FIG. 1, the semiconductor device 110 may include a second insulating member 42. The second insulating member 42 includes a first insulating region 42a. The first semiconductor portion 21 is located between the fifth partial region 15 and the first insulating region 42a. The second insulating member 42 functions, for example, as a protective film. Current collapse can be reduced. It becomes easy to obtain stable operation. For example, it becomes easy to obtain a high breakdown voltage.

The second insulating member 42 includes, for example, at least one selected from the group consisting of SiN, $SiO_2$, SiON, AlSiON, AlON and $Al_2O_3$.

As shown in FIG. 1, the first nitride region 30 may further include a third nitride portion 33. The first semiconductor portion 21 is located between the fifth partial region 15 and the third nitride portion 33. A third nitride portion thickness t33 along the second direction D2 of the third nitride portion 33 may be thicker than the second nitride portion thickness t32. By the third nitride partial thickness t33 being thicker than the second nitride partial thickness t32, for example, it is possible to more effectively suppress the intrusion of impurities from the outside into the second semiconductor region 20 during the manufacturing process.

As shown in FIG. 1, the first nitride region 30 may further include a fourth nitride portion 34. A part of the fourth nitride portion 34 is located between the fourth partial region 14 and the first insulating portion 41a in the first direction D1. The first nitride portion thickness t31 is thicker than a fourth nitride portion thickness t34 of the part of the fourth nitride portion 34 along the first direction D1. The second semiconductor portion thickness t22 along the second direction D2 of the second semiconductor portion 22 is thicker than the first nitride portion thickness t31.

The first insulating member 41 further includes a third insulating portion 41c. For example, at least a part of the third insulating portion 41c is located between the part of the fourth nitride portion 34 and the first insulating portion 41a. For example, at least a part of the third insulating portion 41c may be located between the fourth nitride portion 34 and the first electrode portion 53a. Another part of the fourth nitride portion 34 is located between the second semiconductor portion 22 and the third insulating portion 41c in the first direction D1.

As shown in FIG. 1, the first nitride region 30 may further include a third nitride portion 33 and a fifth nitride portion 35. The first semiconductor portion 21 is located between the fifth partial region 15 and the third nitride portion 33. As already explained, the third nitride portion thickness t33 along the second direction D2 of the third nitride portion 33 is thicker than the second nitride portion thickness t32.

The second semiconductor portion 22 is located between the fourth partial region 14 and the fifth nitride portion 35. A fifth nitride portion thickness t35 along the second direction D2 of the fifth nitride portion 35 is thicker than the second nitride portion thickness t32.

The first insulating member 41 may further include a fourth insulating portion 41d and a fifth insulating portion 41e. The first semiconductor portion 21 is located between the fifth partial region 15 and the fourth insulating portion 41d in the second direction D2. The second semiconductor portion 22 is located between the fourth partial region 14 and the fifth insulating portion 41e in the second direction D2.

The second insulating member 42 may include a second insulating region 42b. The second semiconductor portion 22 is located between the fourth partial region 14 and the second insulating region 42b in the second direction D2.

The semiconductor device 110 may include a base body 18s and a nitride layer 18b. The base body 18s may be, for example, a silicon substrate. The nitride layer 18b is provided on the base body 18s. The first semiconductor region 10 is provided on the nitride layer 18b. The second semiconductor region 20 is provided on the first semiconductor region 10.

Figure 2:
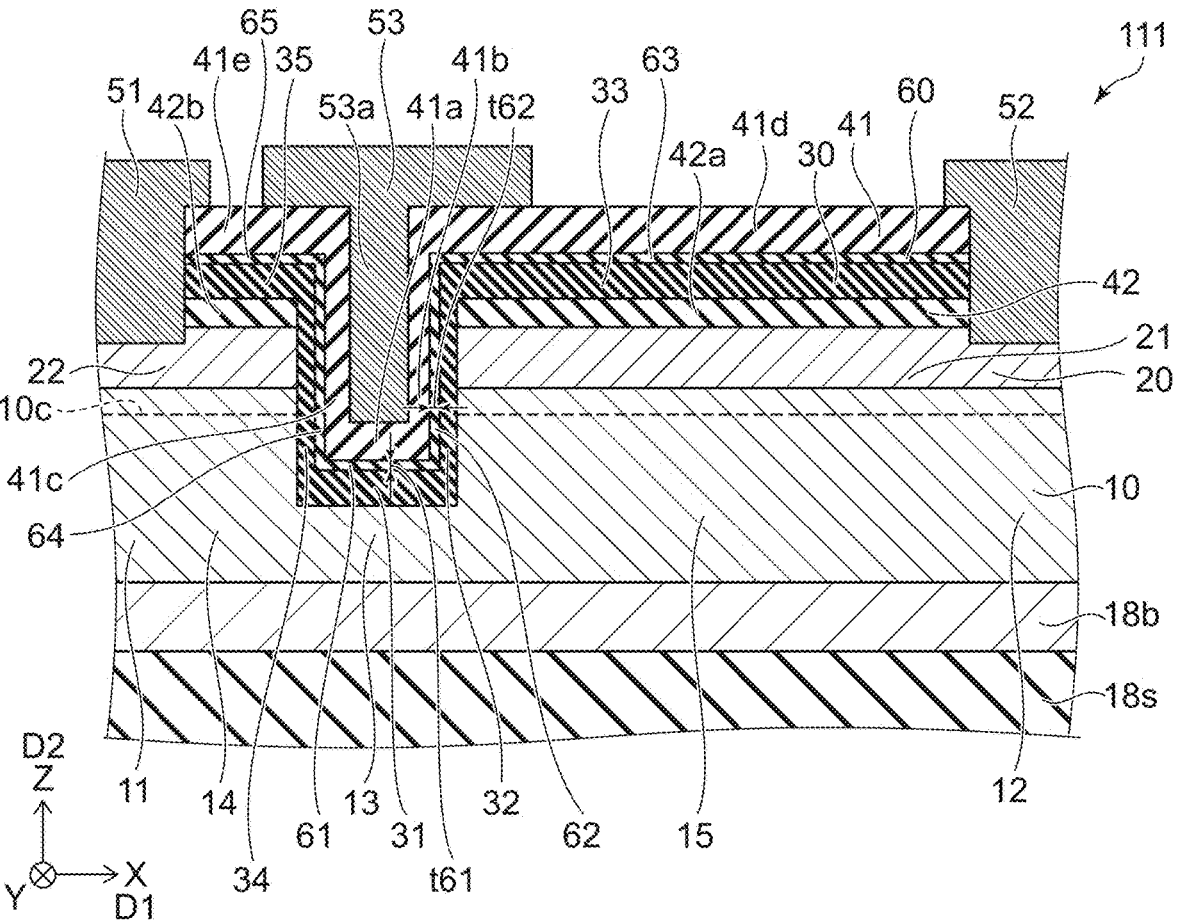
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, a semiconductor device 111 according to the embodiment includes a first compound region 60. Except for this, the configuration of the semiconductor device 111 may be the same as the configuration of the semiconductor device 110.

The first compound region 60 includes Al and oxygen. The first compound region 60 includes, for example, at least one selected from the group consisting of AlO and AlON.

The first compound region 60 includes a first compound portion 61 and a second compound portion 62. The first compound portion 61 is located between the first nitride portion 31 and the first insulating portion 41a. The second compound portion 62 is located between the second insulating portion 41b and the second nitride portion 32.

By providing the first compound region 60, for example, higher carrier mobility can be easily obtained. For example, it becomes easy to obtain a low on-resistance. By providing the first compound region 60, for example, the trap level density at the interface can be reduced. It becomes easy to obtain stable characteristics.

Figure 3:
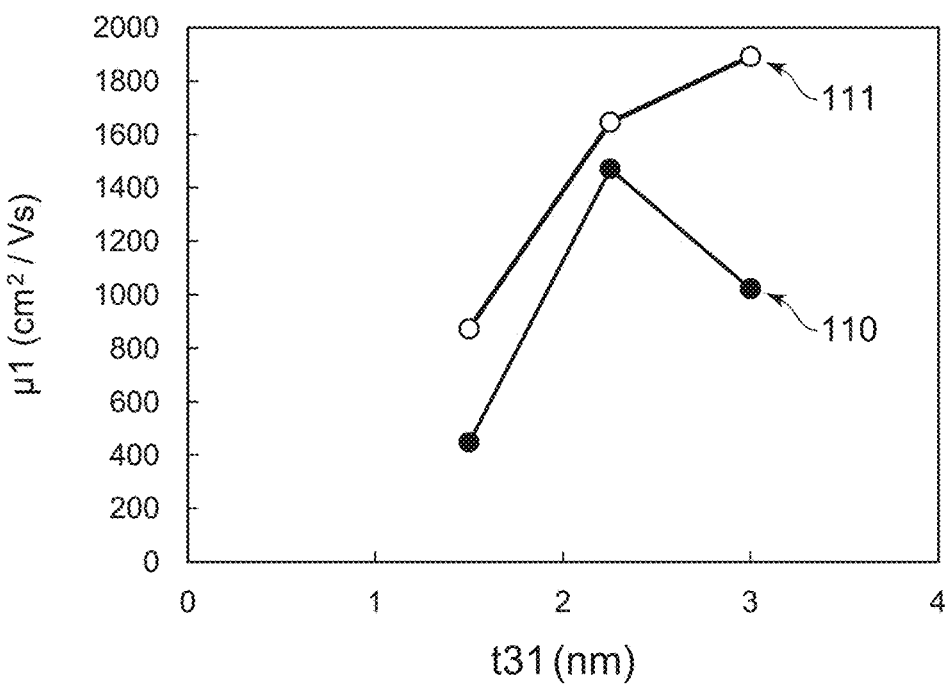
FIG. 3 is a graph illustrating characteristics of the semiconductor device according to the first embodiment.

FIG. 3 is a graph illustrating characteristics of the semiconductor device according to the first embodiment.

FIG. 3 exemplifies the characteristics of the semiconductor device 110 and the characteristics of the semiconductor device 111. The horizontal axis of FIG. 3 is the first nitride partial thickness t31. The vertical axis is the carrier mobility μ1. The first compound region 60 is not provided in the semiconductor device 110. The first compound region 60 is provided in the semiconductor device 111.

As shown in FIG. 3, in the semiconductor device 111, a carrier mobility μ1 higher than that in the semiconductor device 110 is obtained.

In the semiconductor device 111, at least one of the first compound portion 61 or the second compound portion 62 may include an amorphous portion.

A second compound portion thickness t62 (see FIG. 2) along the first direction D1 of the second compound portion 62 may be larger than a first compound portion thickness t61 (see FIG. 2) along the second direction D2 of the first compound portion 61.

For example, the first compound portion thickness t61 is not less than 0.5 nm and not more than 2 nm. For example, the second compound portion thickness t62 is 3 nm or less.

Figure 4:
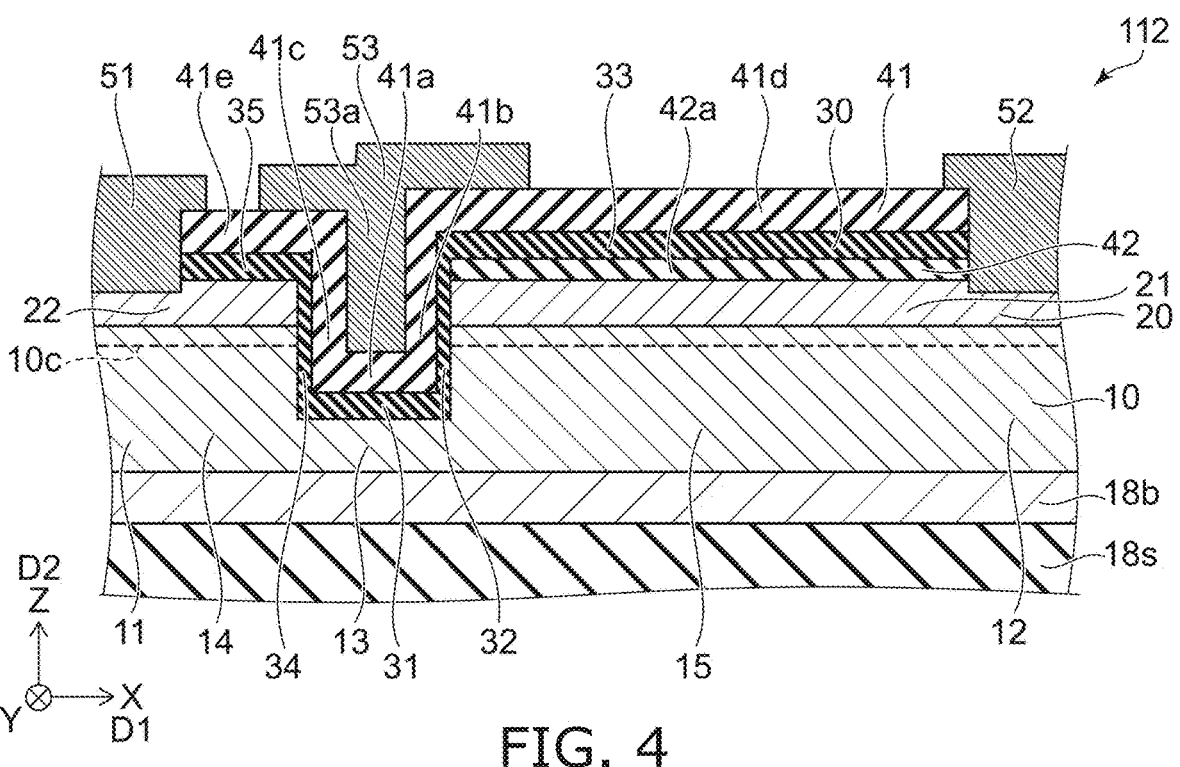
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, in a semiconductor device 112 according to the embodiment, the second insulating region 42b is omitted. Except for this, the configuration of the semiconductor device 112 may be the same as the configuration of the semiconductor device 110 or the configuration of the semiconductor device 111.

In the semiconductor device 112, the second semiconductor portion 22 contacts the fifth nitride portion 35. A high electron carrier concentration is easy to be obtained in the region corresponding to the second semiconductor portion 22. It becomes easy to obtain a low on-resistance. A low on-resistance and a high threshold voltage are also obtained in the semiconductor device 112.

Figure 5:
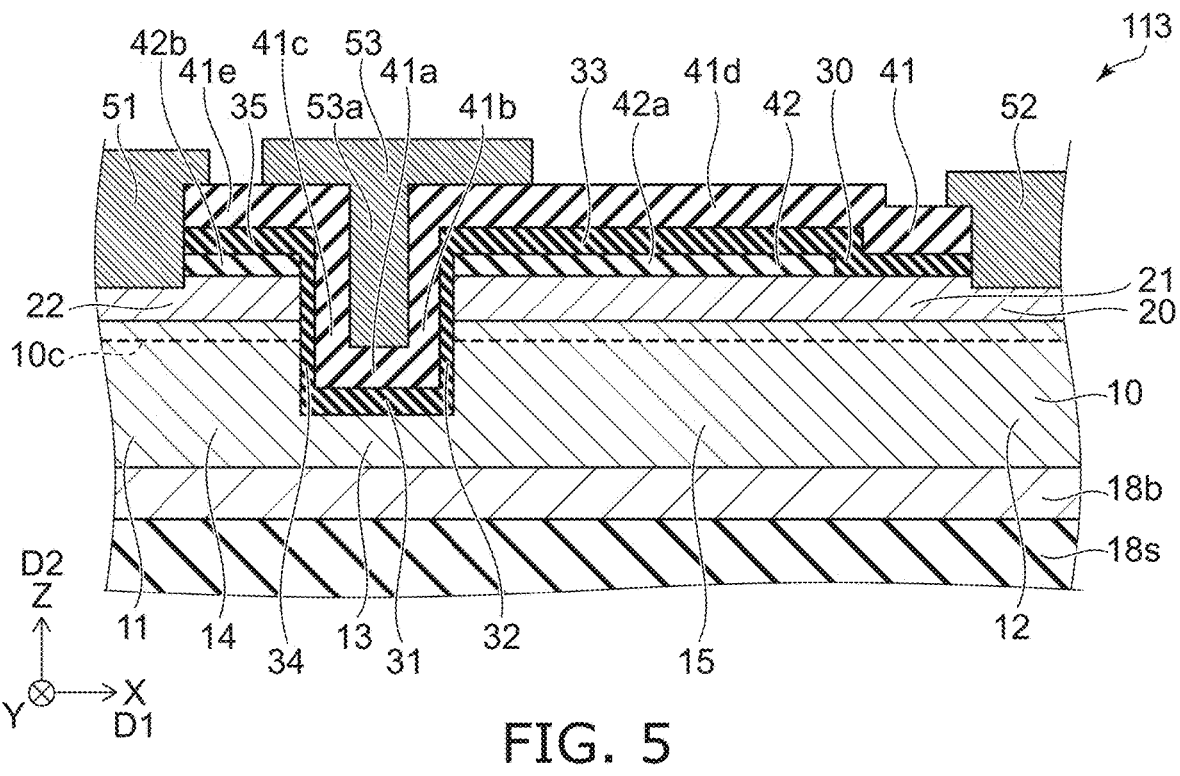
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 113 according to the embodiment, a part of the first nitride region 30 is provided between the first insulating region 42a and the second electrode 52. Except for this, the configuration of the semiconductor device 113 may be the same as the configuration of the semiconductor devices 110-112.

In the semiconductor device 113, for example, current collapse can be suppressed. It is easy to obtain a stable operation. For example, a high carrier concentration can be easily obtained in a region where a part of the first nitride region 30 is provided between the first insulating region 42a and the second electrode 52. It becomes easy to obtain low on-resistance. A low on-resistance and a high threshold voltage can also be obtained in the semiconductor device 113.

Figure 6:
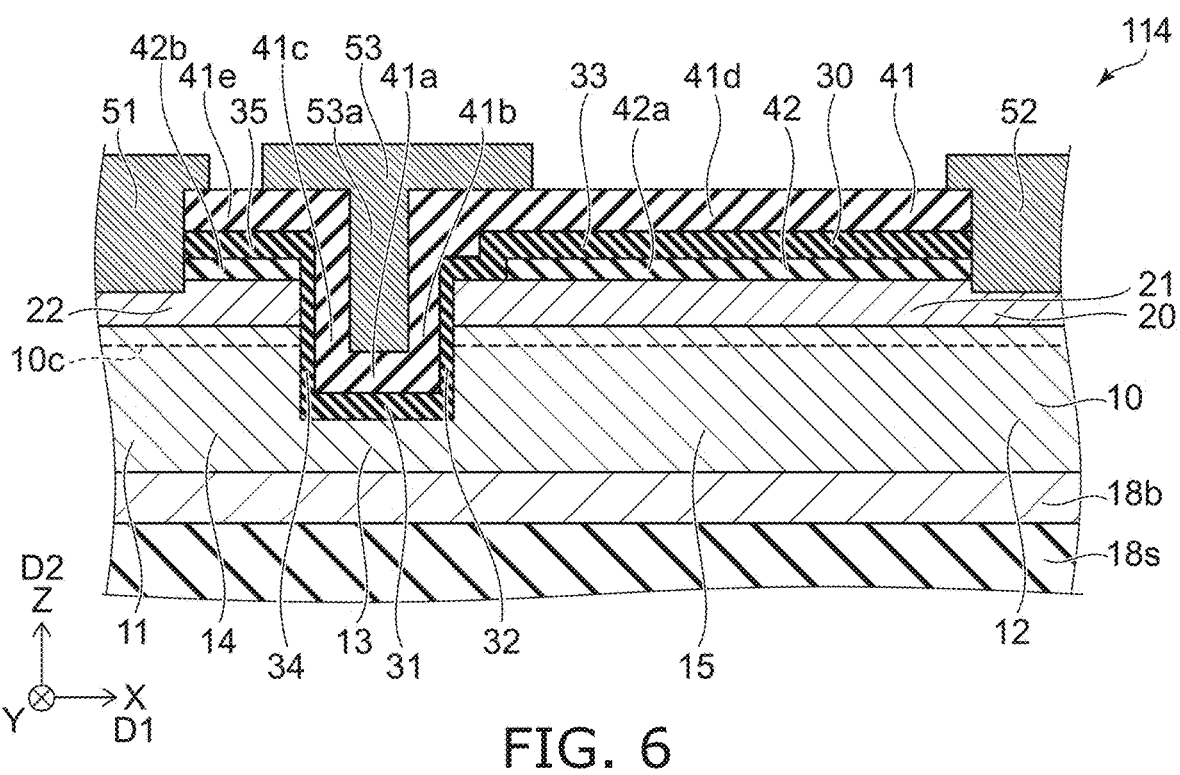
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, in a semiconductor device 114 according to the embodiment, a part of the first face F1 (See FIG. 1) of the first semiconductor portion 21 contacts the first nitride region 30. Another portion of the first face F1 contacts the first insulating region 42a. Except for this, the configuration of the semiconductor device 114 may be the same as the configuration of the semiconductor devices 110-112.

In the semiconductor device 114, the part of the first face F1 contacting the first nitride region 30 overlaps a part of the third electrode 53 in the second direction D2. In the semiconductor device 114, for example, a high carrier concentration can be easily obtained in a region where the first face F1 contacting the first nitride region 30. It becomes easy to obtain a low on-resistance. For example, in the portion where the first face F1 contacts the first nitride region 30, it becomes easy to reduce the trap level density at the interface. It becomes easy to obtain stable operation. In the semiconductor device 114, at least a part of the first insulating region 42a may overlap a part of the third electrode 53 in the second direction D2. It becomes easy to obtain a high breakdown voltage. Also in the semiconductor device 114, a high carrier mobility μ1 and a high threshold voltage are obtained.

Figure 7:
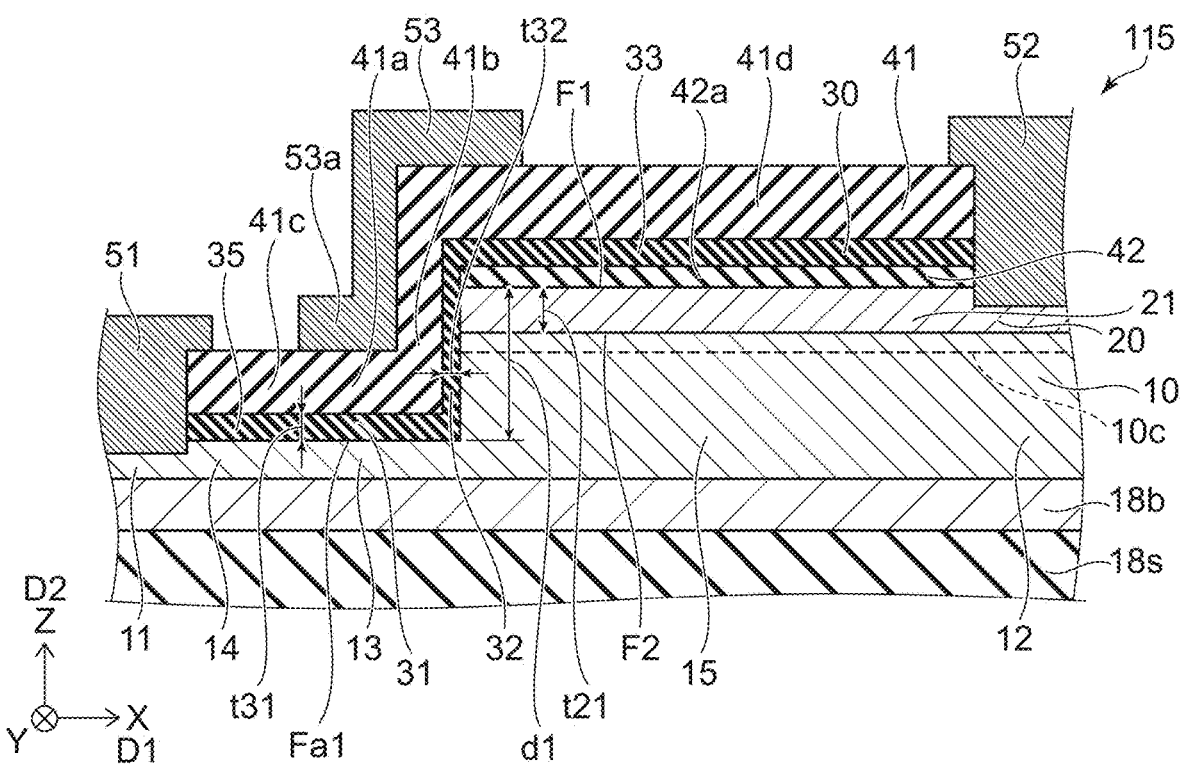
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, in a semiconductor device 115 according to the embodiment, the second semiconductor portion 22 is not provided. Except for this, the configuration of the semiconductor device 115 may be the same as the configuration of the semiconductor devices 110-114.

In the semiconductor device 115, the first nitride region 30 further includes a fifth nitride portion 35. A direction from the fourth partial region 14 to the fifth nitride portion 35 is along the second direction D2. A direction from the fifth nitride portion 35 to the first nitride portion 31 is along the first direction D1. A high carrier mobility μ1 and a high threshold voltage are also obtained in the semiconductor device 115.

Figure 8:
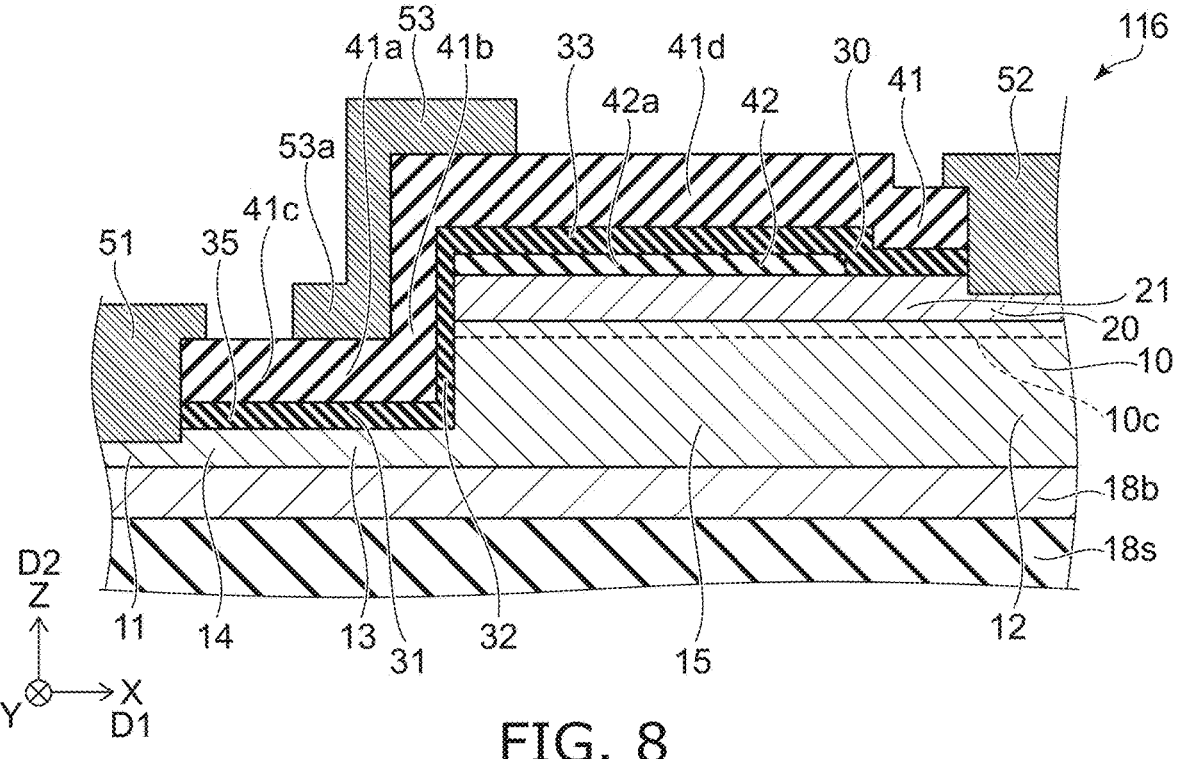
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in the semiconductor device 116 according to the embodiment, the second semiconductor portion 22 is also not provided. In semiconductor device 116, a part of the first nitride region 30 is provided between first insulating region 42a and second electrode 52. Except for this, the configuration of the semiconductor device 116 may be the same as the configuration of the semiconductor device 115. A high carrier mobility μ1 and a high threshold voltage are also obtained in the semiconductor device 116. It becomes easy to obtain stable operation that suppresses current collapse.

Second Embodiment

Figure 9:
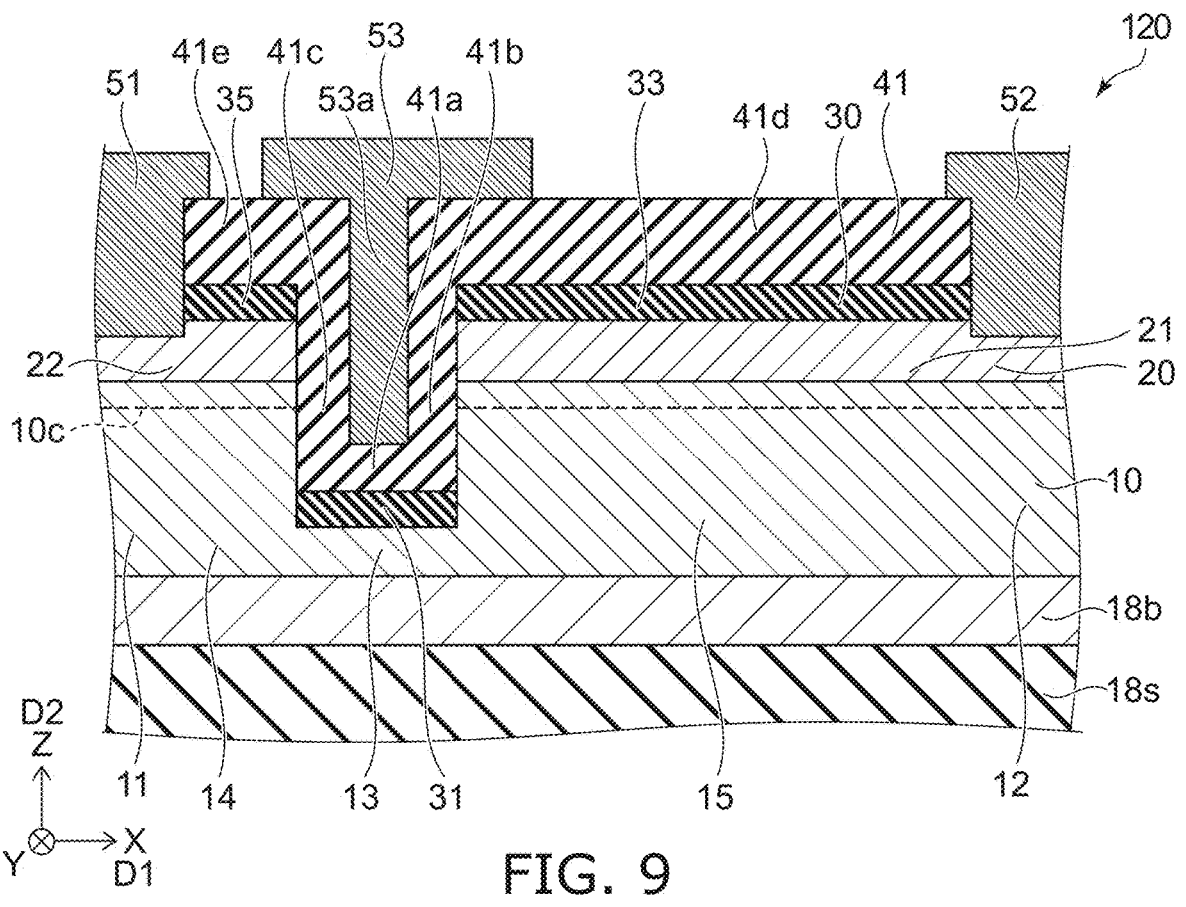
FIG. 9 is a schematic cross-sectional view illustrating a semiconductor device according to a second embodiment.

FIG. 9 is a schematic cross-sectional view illustrating a semiconductor device according to a second embodiment.

As shown in FIG. 9, a semiconductor device 120 according to the embodiment includes a first electrode 51, a second electrode 52, a third electrode 53, a first semiconductor region 10, a second semiconductor region 20, a first nitride region 30, and a first insulating member 41.

The direction from the first electrode 51 to the second electrode 52 is along the first direction D1. The third electrode 53 includes the first electrode portion 53a. The position of the third electrode 53 in the first direction D1 is between the position of the first electrode 51 in the first direction D1 and the position of the second electrode 52 in the first direction D1.

The first semiconductor region 10 includes $Al_{x1}Ga_{1-x1}N$ (0≤x1<1). The first semiconductor region 10 includes the first partial region 11, the second partial region 12, the third partial region 13, the fourth partial region 14, and the fifth partial region 15. The second direction D2 from the first partial region 11 to the first electrode 51 crosses the first direction D1. The direction from the second partial region 12 to the second electrode 52 is along the second direction D2. The direction from the third partial region 13 to the first electrode portion 53a is along the second direction D2. The position of the fourth partial region 14 in the first direction D1 is between the position of the first partial region 11 in the first direction D1 and the position of the third partial region 13 in the first direction D1. The position of the fifth partial region 15 in the first direction D1 is between the position of the third partial region 13 in the first direction D1 and the position of the second partial region 12 in the first direction D1.

The second semiconductor region 20 includes $Al_{x2}Ga_{1-x2}N$ (0<x2<1, x1<x2). The second semiconductor region 20 includes the first semiconductor portion 21. The direction from the fifth partial region 15 to the first semiconductor portion 21 is along the second direction D2.

The first nitride region 30 includes Al and N. The first nitride region 30 includes the first nitride portion 31. The first nitride portion 31 is located between the third partial region 13 and the first electrode portion 53a in the second direction D2. For example, the direction from the first nitride portion 31 to the fifth partial region 15 is along the first direction D1.

The first insulating member 41 includes the first insulating portion 41a and the second insulating portion 41b. The first insulating portion 41a is located between the first nitride portion 31 and the first electrode portion 53a. The direction from at least a part of the first insulating portion 41a to the first semiconductor portion 21 is along the first direction D1. The second insulating portion 41b contacts the fifth partial region 15. The direction from a part of the second insulating portion 41b to the fifth partial region 15 is along the first direction D1. The direction from other portion of the second insulating portion 41b to the first semiconductor portion 21 is along the first direction D1. For example, the other portion of the second insulating portion 41b contacts the first semiconductor portion 21.

The first insulating member 41 includes the first insulating portion 41a and the second insulating portion 41b. In the semiconductor device 120, by providing the first nitride portion 31, a high carrier mobility μ1 can be obtained. By the second insulating portion 41b contacting the fifth partial region 15, for example, a high threshold voltage can be obtained. According to the semiconductor device 120, a semiconductor device with improved characteristics can be provided.

In the semiconductor device 120, the first nitride region 30 includes, for example, $Al_{z1}Ga_{1-z1}N$ (0<z1<1, x2<z1). The composition ratio x2 in the second semiconductor region 20 is, for example, not less than 0.1 and not more than 0.35. The composition ratio z1 in the first nitride region 30 is not less than 0.6 and no more than 1.

In the semiconductor device 120, the second semiconductor region 20 includes the second semiconductor portion 22. The configuration described with respect to the first embodiment may be applied to the semiconductor device 120.

Figure 10:
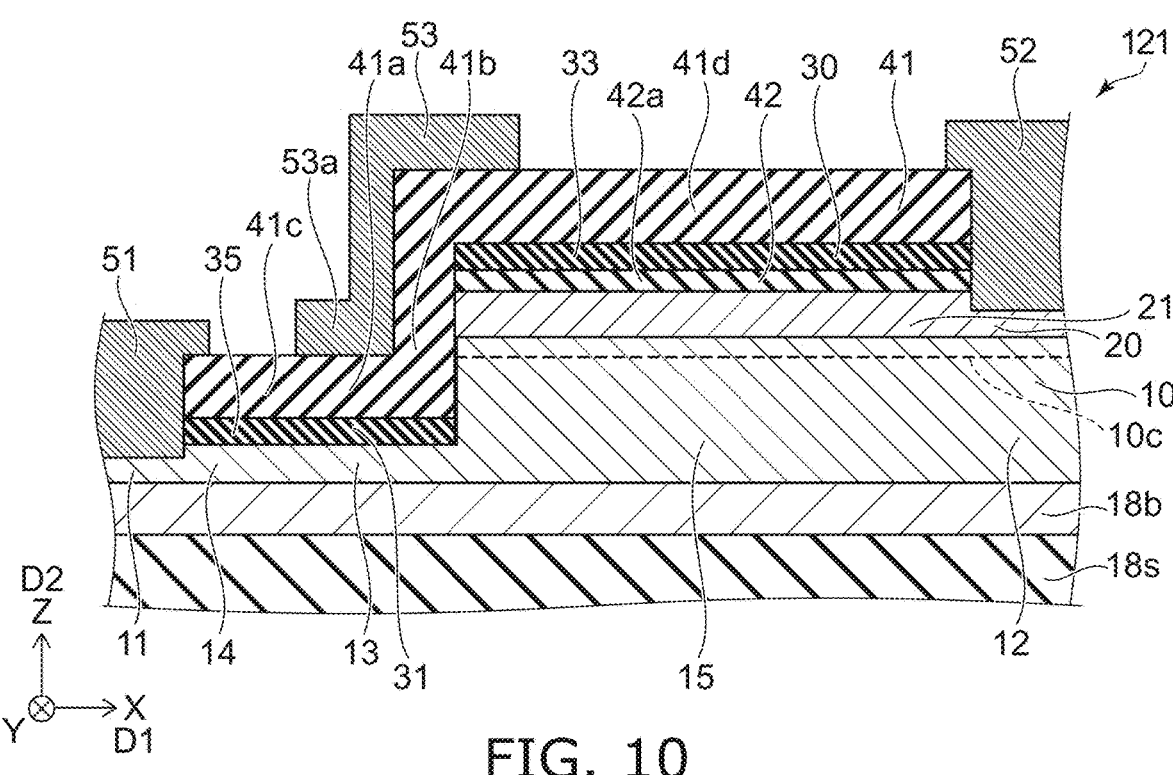
FIG. 10 is a schematic cross-sectional view illustrating a semiconductor device according to the second embodiment.

FIG. 10 is a schematic cross-sectional view illustrating a semiconductor device according to the second embodiment.

As shown in FIG. 10, in the semiconductor device 121 according to the embodiment, the second semiconductor portion 22 is omitted. Except for this, the configuration of the semiconductor device 121 may be the same as the configuration of the semiconductor device 120.

In the semiconductor device 121, the first nitride region 30 further includes the fifth nitride portion 35. The direction from the fourth partial region 14 to the fifth nitride portion 35 is along the second direction D2. The direction from the fifth nitride portion 35 to the first nitride portion 31 is along the first direction D1. Also in the semiconductor device 121, a high carrier mobility μl and a high threshold voltage are obtained.

Third Embodiment

The third embodiment relates to a method of manufacturing a semiconductor device.

FIGS. 11A to 11D and 12A to 12C are schematic cross-sectional views illustrating the method for manufacturing a semiconductor device according to the third embodiment.

Figure 11A:
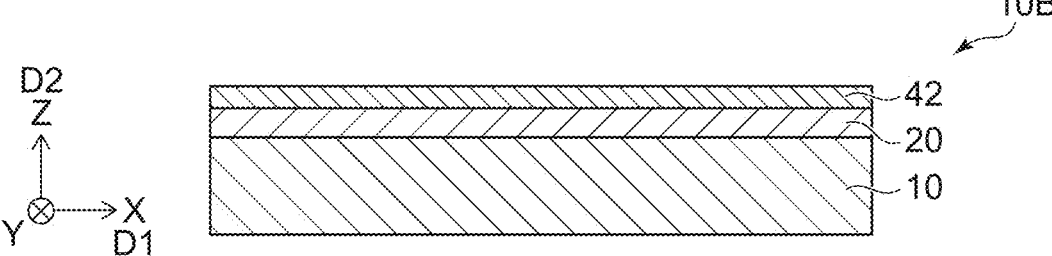
FIGS. 11A to 11D are schematic cross-sectional views illustrating the method for manufacturing a semiconductor device according to a third embodiment.

As shown in FIG. 11A, a structure 10B is prepared. The structure 10B includes the first semiconductor region 10 including $Al_{x1}Ga_{1-x1}N$ (0≤x1<1) and the second semiconductor region 20 including $Al_{x2}Ga_{1-x2}N$ (0<x2<1, x1<x2). The second semiconductor region 20 is provided on the first semiconductor region 10. In this example, the structure 10B includes second insulating member 42. The second insulating member 42 is provided on the second semiconductor region 20.

Figure 11B:
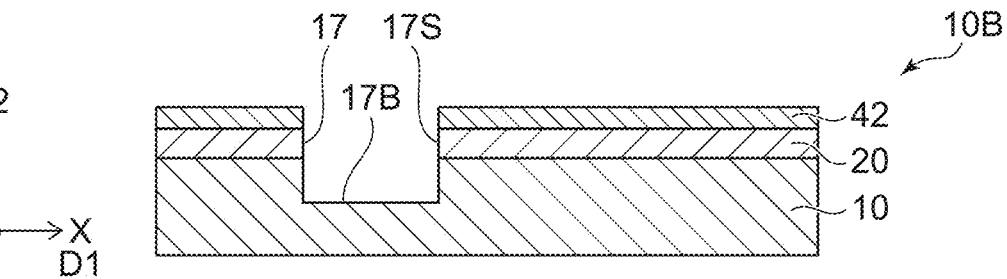

As shown in FIG. 11B, a recess 17 are formed in the structure 10B. For example, the recess 17 can be formed by etching using a mask. The structure 10B may include a recess 17. The recess 17 extends in a direction from the second semiconductor region 20 to first semiconductor region 10. A portion of the first semiconductor region 10 is exposed at a bottom 17B of the recess 17. The second semiconductor region 20 is exposed at the side portion 17S of the recess 17.

Figure 11C:
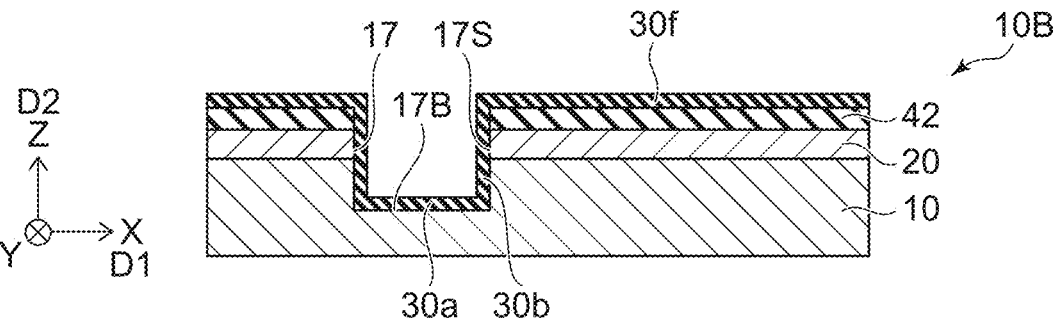

As shown in FIG. 11C, a film 30f including Al and N is formed inside the recess 17. For example, the film 30f can be formed by epitaxial growth. The film 30f includes a first film portion 30a and a second film portion 30b. The first film portion 30a is provided on the bottom 17B of the recess 17. The second film portion 30b is provided on the side portion 17S of the recess 17.

Figure 11D:
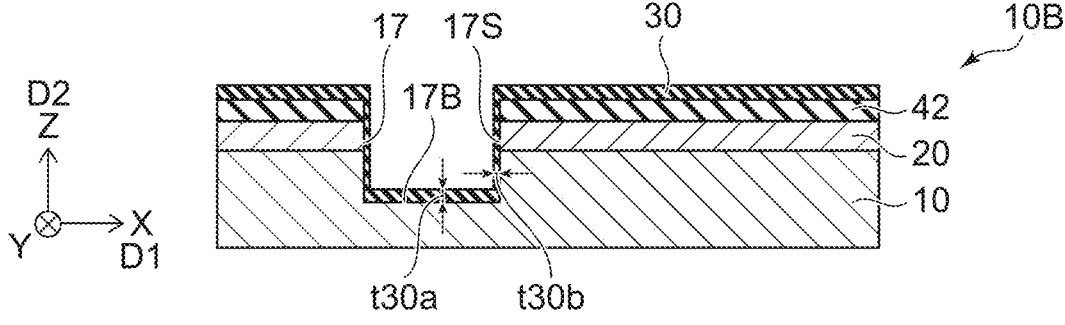

As shown in FIG. 11D, the thickness t30b of the second film portion 30b is made thinner than the thickness t30a of the first film portion 30a.

In one example, after forming a film having a uniform thickness, an additional film is selectively formed on the portion corresponding to the bottom 17B of the recess 17. Thereby, a difference in thickness is obtained. In another example, after the film 30f having a uniform thickness is formed, a part of the film 30f corresponding to the side portion 17S of the recess 17 is selectively removed. Thereby, a difference in thickness is obtained.

In another example, the growth mode and growth conditions of the film 30f are controlled. For example, different growth rates can be obtained depending on the crystal orientation. A thickness difference is obtained by controlling the growth method and the growth condition. In another example, after the film 30f having a uniform thickness is formed, heat treatment or the like is performed. Thereby, the thickness t30a of the second film portion 30b decreases from the thickness before heating. The thickness difference is obtained by various methods. The first nitride region 30 having a difference in thickness is obtained.

Figure 12A:
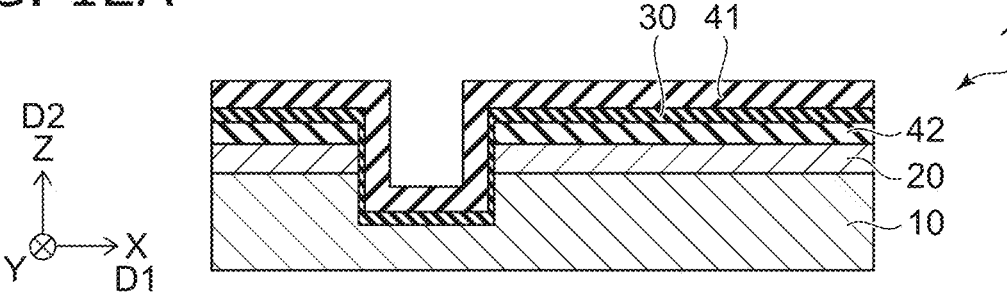
FIGS. 12A to 12C are schematic cross-sectional views illustrating the method for manufacturing the semiconductor device according to the third embodiment.
Figure 12B:
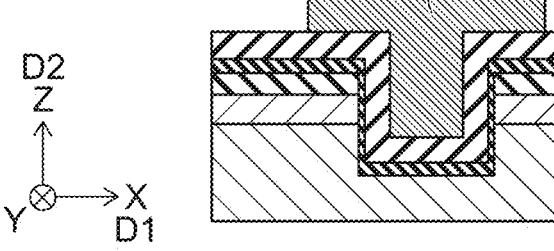
Figure 12C:
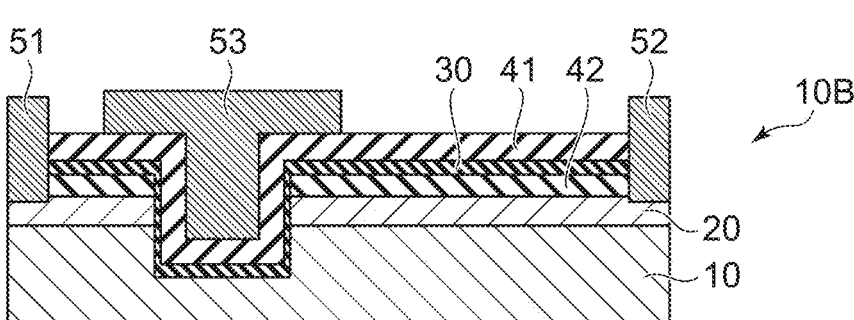

As shown in FIG. 12A, the first insulating member 41 is formed. As shown in FIG. 12 B, the third electrode 53 is formed. As shown in FIG. 12C, the first electrode 51 and the second electrode 52 are formed. In this way, the semiconductor device according to the embodiment is obtained.

The embodiments may include the following configurations (for example, technical proposals).

Configuration 1

A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0 < x2 < 1$, $x1 < x2$), the second semiconductor region including a first semiconductor portion, a direction from the fifth partial region to the first semiconductor portion being along the second direction;

a first nitride region including Al and N, the first nitride region including a first nitride portion and a second nitride portion, the first nitride portion being located between the third partial region and the first electrode portion in the second direction; and a first insulating member including a first insulating portion and a second insulating portion, the first insulating portion being located between the first nitride portion and the first electrode portion, a part of the second nitride portion being located between the first insulating portion and the fifth partial region in the first direction, another part of the second nitride portion being located between the second insulating portion and the first semiconductor portion, a first nitride portion thickness along the second direction of the first nitride portion being thicker than a second nitride portion thickness along the first direction of the part of the second nitride portion, and a first semiconductor portion thickness along the second direction of the first semiconductor portion being thicker than the first nitride portion thickness.

Configuration 2

The semiconductor device according to Configuration 1, wherein the second semiconductor region further includes a second semiconductor portion, a direction from the fourth partial region to the second semiconductor portion is along the second direction, and the first electrode portion is located between the first semiconductor portion and the second semiconductor portion in the first direction.

Configuration 3

The semiconductor device according to Configuration 1 or 2, wherein the first semiconductor portion thickness is not less than 15 nm and not more than 40 nm, the first nitride portion thickness is not less than 1 nm and not more than 10 nm, and the second nitride portion thickness is not less than 0.5 nm and not more than 5 nm.

Configuration 4

The semiconductor device according to any one of Configurations 1-3, wherein the first nitride portion includes $Al_{z1}Ga_{1-z1}N$ ($0 < z1 < 1$, $x2 < z1$), and the second nitride portion includes $Al_{z2}Ga_{1-z2}N$ ($0 < z2 \leq 1$, $z1 < z2$).

Configuration 5

The semiconductor device according to Configuration 4, wherein the x2 is not less than 0.1 and not more than 0.35, and the z1 is not less than 0.6 and less than 1.

Configuration 6

The semiconductor device according to Configuration 5, wherein the z1 is not less than 0.6 and not more than 0.98, and the z2 is more than 0.98 and not more than 1.

Configuration 7

The semiconductor device according to any one of Configurations 1-6, wherein the third partial region includes a first facing face, the first facing face faces the first nitride portion, the first semiconductor portion includes a first face and a second face, the second face faces the fifth partial region, the second face is located between the fifth partial region and the first face in the second direction, and a distance along the second direction between a position of the first facing face in the second direction and a position of the first face in the second direction is not less than 100 nm and not more than 400 nm.

Configuration 8

The semiconductor device according to any one of Configurations 1-7, further comprising:

a first compound region including Al and oxygen, the first compound region including a first compound portion and a second compound portion, the first compound portion being located between the first nitride portion and the first insulating portion, and the second compound portion being located between the second insulating portion and the second nitride portion.

Configuration 9

The semiconductor device according to Configuration 8, wherein
    at least one of the first compound portion or the second compound portion includes an amorphous portion.

Configuration 10

The semiconductor device according to Configuration 8 or 9, wherein
    a second compound portion thickness along the first direction of the second compound portion is thicker than a first compound portion thickness along the second direction of the first compound portion.

Configuration 11

The semiconductor device according to Configuration 10, wherein
    the second compound portion thickness is 3 nm or less.

Configuration 12

The semiconductor device according to any one of Configurations 1-11, wherein
    the first insulating member includes at least one selected from the group consisting of $SiO_2$, SiON, AlSiON, AlON and $Al_2O_3$.

Configuration 13

The semiconductor device according to Configuration 1, further comprising:
    a second insulating member including a first insulating region,
    the first semiconductor portion being located between the fifth partial region and the first insulating region, and
    the second insulating member including at least one selected from the group consisting of SiN, $SiO_2$, SiON, AlSiON, AlON and $Al_2O_3$.

Configuration 14

The semiconductor device according to any one of Configurations 1-13, wherein
    the first nitride region further includes a third nitride portion,
    the first semiconductor portion is located between the fifth partial region and the third nitride portion, and
    a third nitride portion thickness along the second direction of the third nitride portion is thicker than the second nitride portion thickness.

Configuration 15

The semiconductor device according to Configuration 2, wherein
    the first nitride region further includes a fourth nitride portion,
    a part of the fourth nitride portion is located between the fourth partial region and the first insulating portion in the first direction,
    the first nitride portion thickness is thicker than a fourth nitride portion thickness along the first direction of the part of the fourth nitride portion, a second semiconductor portion thickness along the second direction of the second semiconductor portion is thicker than the first nitride portion thickness,
    the first insulating member further includes a third insulating portion, and
    at least a part of the third insulating portion is located between the part of the fourth nitride portion and the first insulating portion.

Configuration 16

The semiconductor device according to Configuration 2, wherein
    the first nitride region further includes a third nitride portion and a fifth nitride portion,
    the first semiconductor portion is located between the fifth partial region and the third nitride portion,
    a third nitride portion thickness along the second direction of the third nitride portion is thicker than the second nitride portion thickness,
    the second semiconductor portion is located between the fourth partial region and the fifth nitride portion, and
    a fifth nitride portion thickness along the second direction of the fifth nitride portion is thicker than the second nitride portion thickness.

Configuration 17

The semiconductor device according to Configuration 1, wherein
    the first nitride region further includes a fifth nitride portion,
    a direction from the fourth partial region to the fifth nitride portion is along the second direction, and
    a direction from the fifth nitride portion to the first nitride portion is along the first direction.

Configuration 18

The semiconductor device, comprising:
    a first electrode;
    a second electrode, a direction from the first electrode to the second electrode being along a first direction;
    a third electrode including a first electrode portion, a position of the third electrode in the first direction being between a position of the first electrode in the first direction and a position of the second electrode in the first direction;
    a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;
    a second semiconductor region including $Al_{x2}Ga_{1-x2}N$ ($0 < x2 < 1$, $x1 < x2$), the second semiconductor region including a first semiconductor portion, a direction from the fifth partial region to the first semiconductor portion being along the second direction;

a first nitride region including Al and N, the first nitride region including a first nitride portion, the first nitride portion being located between the third partial region and the first electrode portion in the second direction; and a first insulating member including a first insulating portion and a second insulating portion, the first insulating portion being located between the first nitride portion and the first electrode portion, the second insulating portion contacting the fifth partial region.

Configuration 19

The semiconductor device according to Configuration 18, wherein the first nitride region includes $Al_{z1}Ga_{1-z1}N$ ($0<z1<1$, $x2<z1$), the x2 is not less than 0.1 and not more than 0.35, and the z1 is not less than 0.6 and not more than 1.

Configuration 20

A method for manufacturing a semiconductor device, the method comprising:

providing a structure, the structure including a first semiconductor region including $Al_{x1}Ga_{1-x1}N$ ($0\leq x1<1$), and a second semiconductor region including $Al_{x2}Ga_{1-x2}N$ ($0<x2<1$, $x1<x 2$), the structure including a recess, the recess extends in a direction from the second semiconductor region to the first semiconductor region, a part of the first semiconductor region being exposed at a bottom of the recess;

forming a film including Al and N inside the recess, the film including a first film portion and a second film portion, the first film portion being provided at the bottom of the recess, the second film portion being provided at a side portion of the recess; and making a thickness of the second film portion thinner than a thickness of the first film portion.

According to the embodiments, a semiconductor device capable of improving characteristics and a method of manufacturing the same are provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, nitride regions, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods of manufacturing the same practicable by an appropriate design modification by one skilled in the art based on the semiconductor devices and methods of manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0\leq x1<1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0<x2<1$, $x1<x2$), the second semiconductor region including a first semiconductor portion, a direction from the fifth partial region to the first semiconductor portion being along the second direction;

a first nitride region including Al and N, the first nitride region including a first nitride portion and a second nitride portion, the first nitride portion being located between the third partial region and the first electrode portion in the second direction; and a first insulating member including a first insulating portion and a second insulating portion, the first insulating portion being located between the first nitride portion and the first electrode portion, a part of the second nitride portion being located between the first insulating portion and the fifth partial region in the first direction, another part of the second nitride portion being located between the second insulating portion and the first semiconductor portion, a first nitride portion thickness along the second direction of the first nitride portion being thicker than a second nitride portion thickness along the first direction of the part of the second nitride portion, and a first semiconductor portion thickness along the second direction of the first semiconductor portion being thicker than the first nitride portion thickness, wherein the first semiconductor portion thickness is not less than 15 nm and not more than 40 nm, the first nitride portion thickness is not less than 1 nm and not more than 10 nm, and the second nitride portion thickness is not less than 0.5 nm and not more than 5 nm.

2. The semiconductor device according to claim 1, wherein the second semiconductor region further includes a second semiconductor portion, a direction from the fourth partial region to the second semiconductor portion is along the second direction, and the first electrode portion is located between the first semiconductor portion and the second semiconductor portion in the first direction.

3. The semiconductor device according to claim 2, wherein the first nitride region further includes a fourth nitride portion, a part of the fourth nitride portion is located between the fourth partial region and the first insulating portion in the first direction, the first nitride portion thickness is thicker than a fourth nitride portion thickness along the first direction of the part of the fourth nitride portion, a second semiconductor portion thickness along the second direction of the second semiconductor portion is thicker than the first nitride portion thickness, the first insulating member further includes a third insulating portion, and at least a part of the third insulating portion is located between the part of the fourth nitride portion and the first insulating portion.

4. The semiconductor device according to claim 2, wherein the first nitride region further includes a third nitride portion and a fifth nitride portion, the first semiconductor portion is located between the fifth partial region and the third nitride portion, a third nitride portion thickness along the second direction of the third nitride portion is thicker than the second nitride portion thickness, the second semiconductor portion is located between the fourth partial region and the fifth nitride portion, and a fifth nitride portion thickness along the second direction of the fifth nitride portion is thicker than the second nitride portion thickness.

5. The semiconductor device according to claim 1, wherein the third partial region includes a first facing face, the first facing face faces the first nitride portion, the first semiconductor portion includes a first face and a second face, the second face faces the fifth partial region, the second face is located between the fifth partial region and the first face in the second direction, and a distance along the second direction between a position of the first facing face in the second direction and a position of the first face in the second direction is not less than 100 nm and not more than 400 nm.

6. The semiconductor device according to claim 1, further comprising:

a first compound region including Al and oxygen, the first compound region including a first compound portion and a second compound portion, the first compound portion being located between the first nitride portion and the first insulating portion, and the second compound portion being located between the second insulating portion and the second nitride portion.

7. The semiconductor device according to claim 6, wherein at least one of the first compound portion or the second compound portion includes an amorphous portion.

8. The semiconductor device according to claim 1, wherein the first insulating member includes at least one selected from the group consisting of $SiO_2$, SiON, AlSiON, AlON and $Al_2O_3$.

9. The semiconductor device according to claim 1, further comprising:

a second insulating member including a first insulating region, the first semiconductor portion being located between the fifth partial region and the first insulating region, and the second insulating member including at least one selected from the group consisting of SiN, $SiO_2$, SiON, AlSiON, AlON and $Al_2O_3$.

10. The semiconductor device according to claim 1, wherein the first nitride region further includes a third nitride portion, the first semiconductor portion is located between the fifth partial region and the third nitride portion, and a third nitride portion thickness along the second direction of the third nitride portion is thicker than the second nitride portion thickness.

11. The semiconductor device according to claim 1, wherein the first nitride region further includes a fifth nitride portion, a direction from the fourth partial region to the fifth nitride portion is along the second direction, and a direction from the fifth nitride portion to the first nitride portion is along the first direction.

12. A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0<x2<1$, $x1<x2$), the second semiconductor region including a first semiconductor portion, a direction from the fifth partial region to the first semiconductor portion being along the second direction;

a first nitride region including Al and N, the first nitride region including a first nitride portion and a second nitride portion, the first nitride portion being located between the third partial region and the first electrode portion in the second direction; and a first insulating member including a first insulating portion and a second insulating portion, the first insulating portion being located between the first nitride portion and the first electrode portion, a part of the second nitride portion being located between the first insulating portion and the fifth partial region in the first direction, another part of the second nitride portion being located between the second insulating portion and the first semiconductor portion, a first nitride portion thickness along the second direction of the first nitride portion being thicker than a second nitride portion thickness along the first direction of the part of the second nitride portion, and a first semiconductor portion thickness along the second direction of the first semiconductor portion being thicker than the first nitride portion thickness, wherein the first nitride portion includes $Al_{z1}Ga_{1-z1}N$ ($0<z1<1$, $x2<z1$), and the second nitride portion includes $Al_{z2}Ga_{1-z2}N$ ($0<z2\leq1$, $z1<z2$).

13. The semiconductor device according to claim 12, wherein the x2 is not less than 0.1 and not more than 0.35, and the z1 is not less than 0.6 and less than 1.

14. The semiconductor device according to claim 13, wherein the z1 is not less than 0.6 and not more than 0.98, and the z2 is more than 0.98 and not more than 1.

15. A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including Alx1Ga1-x1N ($0\leq x1<1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0<x2<1$, $x1<x2$), the second semiconductor region including a first semiconductor portion, a direction from the fifth partial region to the first semiconductor portion being along the second direction;

a first nitride region including Al and N, the first nitride region including a first nitride portion and a second nitride portion, the first nitride portion being located between the third partial region and the first electrode portion in the second direction;

a first insulating member including a first insulating portion and a second insulating portion, the first insulating portion being located between the first nitride portion and the first electrode portion, a part of the second nitride portion being located between the first insulating portion and the fifth partial region in the first direction, another part of the second nitride portion being located between the second insulating portion and the first semiconductor portion; and a first compound region including Al and oxygen, a first nitride portion thickness along the second direction of the first nitride portion being thicker than a second nitride portion thickness along the first direction of the part of the second nitride portion, and a first semiconductor portion thickness along the second direction of the first semiconductor portion being thicker than the first nitride portion thickness, the first compound region including a first compound portion and a second compound portion, the first compound portion being located between the first nitride portion and the first insulating portion, and the second compound portion being located between the second insulating portion and the second nitride portion, wherein a second compound portion thickness along the first direction of the second compound portion is thicker than a first compound portion thickness along the second direction of the first compound portion.

16. The semiconductor device according to claim 15, wherein the second compound portion thickness is 3 nm or less.

17. A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0\leq x1<1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ (0<x2<1, x1<x2), the second semiconductor region including a first semiconductor portion, a direction from the fifth partial region to the first semiconductor portion being along the second direction;

a first nitride region including Al and N, the first nitride region including a first nitride portion, the first nitride portion being located between the third partial region and the first electrode portion in the second direction; and a first insulating member including a first insulating portion and a second insulating portion, the first insulating portion being located between the first nitride portion and the first electrode portion, the second insulating portion contacting the fifth partial region, wherein the first nitride region includes Alz1Ga1-z1N (0<z1<1, x2<z1), the x2 is not less than 0.1 and not more than 0.35, and the z1 is not less than 0.6 and not more than 1.

\* \* \* \* \*